United States Patent [19]

Feng et al.

[11] 3,982,943

[45] Sept. 28, 1976

[54] LIFT-OFF METHOD OF FABRICATING THIN FILMS AND A STRUCTURE UTILIZABLE AS A LIFT-OFF MASK

[75] Inventors: Bai C. Feng, Wappingers Falls, N.Y.; Richard H. Flachbart, Brookfield Center, Conn.; Leonard J. Fried; Harold A. Levine, both of Poughkeepsie, N.Y.

[73] Assignee: IBM Corporation, Armonk, N.Y.

[22] Filed: Mar. 5, 1974

[21] Appl. No.: 448,327

[52] U.S. Cl. .................................... 96/38.4; 96/68
[51] Int. Cl.² ........................ G03C 5/00; G03C 3/00
[58] Field of Search ............................. 96/38.4, 68

[56] References Cited
UNITED STATES PATENTS

| | | | |
|---|---|---|---|
| 3,069,268 | 12/1962 | Herrick | 96/68 |
| 3,666,473 | 5/1972 | Colom et al. | 96/91 D |
| 3,834,907 | 9/1974 | Bissonette | 96/100 |
| 3,849,136 | 11/1974 | Grebe | 96/36.2 |
| 3,873,361 | 3/1975 | Franco et al. | 204/192 |

OTHER PUBLICATIONS
Kodak Photosensitive Resists–Chemical Milling Bull., 1968, pp. 8–12.
IBM Tech. Disc. Bultn. – Burton et al., vol. 12, No. 11, p. 1975.

Primary Examiner—David Klein
Assistant Examiner—L. V. Falasco
Attorney, Agent, or Firm—J. B. Kraft

[57] ABSTRACT

A method for use in forming thin film patterns in the fabrication of integrated circuits. The method involves depositing a bottom layer of positive photoresist material on a substrate, and forming over the bottom layer, a discrete light-transparent top layer of positive photoresist material which is less solubilized in developer after exposure to light than is the material in the bottom layer. The top and bottom layers are preferably separated by an intermediate layer of a light-transparent polymeric material which is immiscible in the bottom layer and unaffected by the subsequently applied top layer.

The composite structure is exposed to a selected pattern of light, e.g., through a mask, and developer for the positive photoresist material is applied to the top and bottom layers. In the case where an intermediate layer is used, the top layer is developed first. Then, the intermediate layer is removed where exposed in the apertures through the top layer, preferably by ashing, after which, the bottom layer is subjected to the developer. In the resulting structure, the bottom layer has an aperture pattern coincident with and laterally wider than that of the top layer. The thin films are then deposited onto a substrate through the coincident aperture patterns with the photoresist layer serving as a deposition mask.

16 Claims, 9 Drawing Figures

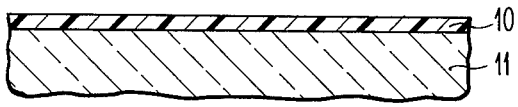
FIG. 1A — APPLY FIRST POSITIVE PHOTORESIST LAYER

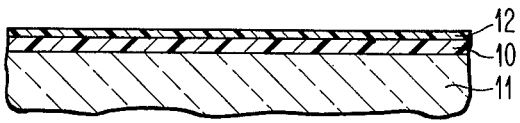
FIG. 1B — APPLY THIN POLYMERIC SEPERATING LAYER

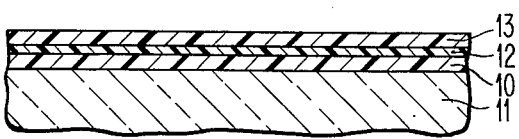
FIG. 1C — APPLY SECOND POSITIVE PHOTORESIST LAYER

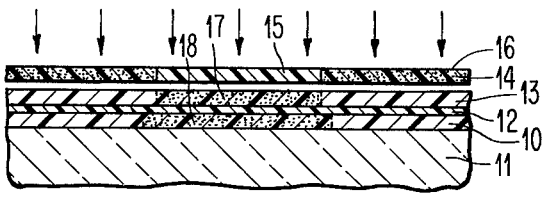
FIG. 1D — MASK AND EXPOSE

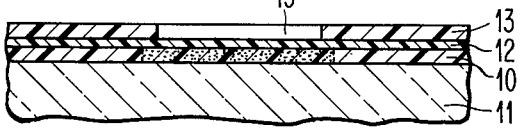
FIG. 1E — DEVELOP SECOND PHOTORESIST LAYER

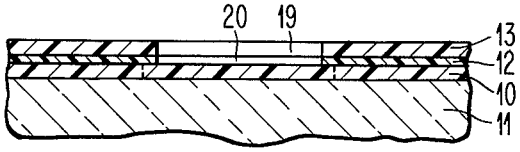
FIG. 1F — REMOVE SEPARATING LAYER BY ASHING

FIG. 1G — DEVELOP FIRST PHOTORESIST LAYER

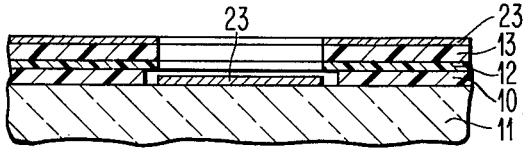
FIG. 1H — DEPOSIT THIN METALLIC FILM

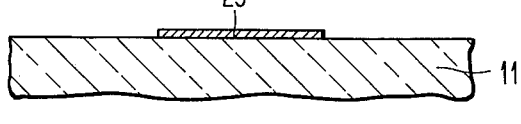
FIG. 1I — REMOVE REMAINING PHOTORESIST LAYERS BY LIFT-OFF 3,982,943

LIFT-OFF METHOD OF FABRICATING THIN FILMS AND A STRUCTURE UTILIZABLE AS A LIFT-OFF MASK

BACKGROUND OF INVENTION

This invention relates to a method of forming thin film patterns, particularly thin films such as metallic films, in the fabrication of integrated circuits.

Present trends in the formation of vacuum deposited thin metallic film patterns make the use of etching in the presence of etch-resist photoresist layers to provide the selected pattern. This, in effect, involves the traditional photoengraving or photolithographic etching techniques. However, with the continued miniaturization of semiconductor integrated circuits to achieve greater component density and smaller units in large scale integrated circuitry, the art is rapidly approaching a point where such photolithographic etching of deposited film may be impractical for providing the minute resolution required for the fine linework of metallization, particularly at appreciable metal thicknesses in the order of 8000A – 25,000A, in such large scale integrated circuitry.

An alternative method for forming such metallization in large scale integrated circuitry, which is presently under consideration and use in the art, is commonly denoted by the term "expendable mask method," "lift-off method," or "stencil method." The following references are typical of those describing these known types of methods.
  1. T. D. Schlaback et al., "*Printed and Integrated Circuitry*," pp. 352–353, McGraw-Hill, New York, 1963.
  2. K. C. Hu, "Expendable Mask: A New Technique for Patterning Evaporated Metal Films," *Electron Packaging and Production*, October 1967.
  3. M. Hatzakis, "Electron Resist for Micro-Circuit and Mask Production," *Journal of The Electrochemical Society*, Vol. 116, p. 1033, 1969.
  4. H. I. Smith et al., "A High-Yield Photolithographic Technique for Surface Wave Devices," *Journal of The Electrochemical Society*, Volume 118, p. 821, 1971.

U.S. Pat. No. 3,849,136 entitled "Masking of Deposited Thin Films by Use of a Masking Layer-photoresist Composite," filed July 31, 1973, assigned to the assignee of the present application, is directed to a lift-off method and structure for depositing thin films which avoid the "edge-tearing" problem. The method involves the formation of a metallic masking layer over an initial layer of photosensitive material on the substrate. The photosensitive layer is then over-exposed through the openings in the masking layer, after which the exposed portions of the photosensitive layer are removed chemically, e.g., by photoresist development. Because of this over-exposure, the removed photoresist provides a structure wherein the openings in the masking layer are smaller than the openings in the underlying photosensitive layer. As a result, an overhang of the metallic masking layer is provided over openings in the photosensitive layer. Because of this overhang, when thin films, particularly metal films, are deposited over the structure, and the remaining photoresist is removed by standard lift-off techniques, the "edge-tearing" problem is minimized.

Where lateral widths of the thin film lines, e.g., metallic lines, to be deposited are spaced in the order of 0.5 mils or greater, the method of said copending application provides a satisfactory and workable lift-off technique for depositing thin films, particularly thin metallic films, without any "edge-tearing" problems. However, where the lateral widths of the spacing between such deposited lines is narrower, in the order of 0.05 to 0.25 mils, some difficulty may be expected to arise in maintaining complete adhesion of the metallic mask to the underlying photoresist as well as in maintaining adhesion of the deposited thin film metallic lines.

U.S. Pat. No. 3,873,361, entitled "A method of Depositing Thin Film Utilizing a Lift-Off Mask," filed Nov. 29, 1973, assigned to the assignee of the present application, is directed to a lift-off metod utilizing another overhang type structure which avoids the "edge-tearing" problem and is utilizable even with narrow widths of spacing between lines in the order of 0.05 to 0.25 mils with a minimum of problems. The method of said application does not utilize a photosensitive or active photoresist bottom layer, and forms apertures through the bottom layer by sputter etching rather than by photolithographic techniques.

BRIEF SUMMARY OF THE PRESENT INVENTION

The present invention provides a method which achieves all of the advantageous results of U.S. Pat. No. 3,873,361, without the need of sputter etching to form openings through the bottom layer. Rather, openings are formed through the bottom layer by photolithographic techniques.

Accordingly, it is a primary object of the present invention to provide an improved method for forming thin film patterns with well defined edges.

It is another object of the present invention to provide an improved lift-off method for such thin film patterns utilizing a masking structure which is non-metallic.

It is still another object of the present invention to provide a method for forming thin film patterns by lift-off techniques where the deposited thin film lines have lateral dimensions and spacing of under 0.25 mils.

It is yet another object of the present invention to provide a method for forming thin film lines having lateral dimensions and spacing in the order of under 0.25 mils by a substantially photolithographic lift-off technique.

The present method of depositing patterned thin film on an inorganic substrate comprises first forming on the substrate a bottom layer of positive photoresist material. A discrete light-transparent top layer of positive photoresist, which is less solubilized in developer by exposure to light than is the material in said bottom layer, is then formed over the bottom layer. It is important that the top layer remain discrete and immiscible with the bottom layer during the deposition of the top layer. This is accomplished preferably by forming on the bottom layer prior to the formation of the top layer, an intermediate layer of light-transparent polymeric material which is immiscible with the bottom layer and unaffected by the subsequently applied top layer.

Next, the composite structure is exposed to a selected pattern of light, e.g., by a mask, after which developer for the photoresist materials is applied to the top and bottom layers to thereby form an aperture pattern through the top layer corresponding to the light pattern and a corresponding aperture pattern through the bottom layer coincident with and laterally wider than the top layer aperture.

Where an intermediate polymeric layer has been used between the top and bottom layers, it is necessary, after the formation of the aperture through the top layer, to remove portions of the polymeric layer corresponding to the aperture pattern through the top layer prior to applying developer to the bottom layer.

The thin films are then deposited onto the substrate through the coincident aperture pattern in the photoresist layer composite; the photoresist layer composite thus serves as a deposition mask.

The present invention further covers the novel composite structure utilized in the previously described method comprising an inorganic substrate covered with a composite comprising a bottom layer of positive photoresist, a top layer of light-transparent positive photoresist, and a layer between the top and bottom layers of a light-transparent polymeric material which is not solubilized upon exposure to light. The photoresist in the top layer is less solubilized to positive photoresist developer by exposure to light than is the photoresist in the bottom layer.

The foregoing and other objects, features and advantages of the invention will be apparent from the following more particular description and preferred embodiments of the invention as illustrated in the accompanying drawings.

BRIEF DESCRIPTION OF THE DRAWINGS

FIGS. 1A–1I are diagrammatic, fragmentary, cross-sectional views of a structure being fabricated in accordance with the preferred embodiments of the present invention, as well as a flow chart describing each of the steps.

DETAILED DESCRIPTION OF THE PREFERRED EMBODIMENTS

FIGS. 1A–1I show the formation of a composite mask in accordance with the method of the present invention as well as the utilization of this composite mask for lift-off purposes. With reference to FIG. 1A, a layer of a "fast" photoresist material 10 is formed on semiconductor substrate 11. In the fabrication of integrated circuits, substrate 11 may be a semiconductor material or a semiconductor substrate having a surface layer of an electrically insulative organic material, such as silicon dioxide. Layer 10 may be formed of a "fast" positive photoresist composition such as described in U.S. Pat. No. 3,666,473. The "fast" positive photoresist composition described in said patent becomes solubilized in photoresist developer upon exposure to light at a greater rate, i.e., to a greater extent, than the standard positive photoresist compositions such as those described in U.S. Pat. No. 3,201,239.

For example, layer 10 may convneiently have the photoresist composition described in Example 1, Composition II, in U.S. Pat. No. 3,666,473. The composition is applied to substrate 11 by conventional spin coating at 4000 rpm and prebaked at 100°C for thirty minutes to give a coating of ~ 15,000A thickness.

Next, FIG. 1B, a thin layer 12 of a polymeric material which will act to prevent mixing of "fast" photoresist layer 10 with a subsequently applied top layer is formed. The purpose of layer 12 is to prevent any mixing between "fast" positive photoresist layer 10 and positive photoresist layer 13, FIG. 1C, which is "slower," i.e., solubilized to a lesser extent upon exposure to light. Because we have found that for the best results, we utilize "fast" and "slow" photoresist materials which have the same solvent system, it is desirable to have an intermediate layer 12 which is unaffected by such solvents separating the two layers in order to retain two discrete layers. Of course, the solvent used in the deposition of layer 12 must be one which does not affect bottom positive photoresist layer 10.

When utilizing the previously described positive photoresist layer 10, the material in the layer is substantially unaffected by solutions of polymers in water based or hydrocarbon, both aliphatic or aromatic, solvents. Such polymeric coating compositions include: cyclized poly-cis-isoprene in hydrocarbon (aliphatic and/or aromatic) solvents, polystyrene in similar solvents, polyisobutylene in similar solvents, and idene resins in such solvents. Typical aromatic coating systems are benzene, toluene and xylenes. Aliphatic solvents include, for example, hexanes, naphthals, mineral spirits, kerosene and turpentine.

In the embodiment shown, poly-cis-isoprene in a xylene or toluene solvent may be conveniently used. Alternatively, KTFR, a negative photoresist material, in a one part KTFR to ten part by volume xylene solution may be conveniently used. KTFR is distributed by Kodak Corporation and is a cyclized poly-cis-isoprene composition containing a photosensitive cross-linking agent. Layer 12 is formed by spin coating at 5000 rpm. It is prebaked at 100°C for twenty minutes. The coating has a thickness of ~ 1000A. Next, as shown in FIG. 1C, a layer of "slower" positive photoresist 13 is formed. This "slower" photoresist may conveniently be Composition I, Example 1, U.S. Pat. No. 3,666,473. It is coated by spin coating at 4000 rpm followed by a bake at 100°C for 20 minutes in a nitrogen-purged oven.

It should be understood that the practice of the present invention is not limited to the compositions of the particular positive photoresists described. For the practice of the invention, it is only critical that the bottom layer of positive photoresist be "faster" and the top layer of positive photoresist be "slower" when exposed to light. If the layers have this relationship, the bottom layer will solubilize more extensively when subjected to light to provide the "over-hang" structure as will be hereinafter described.

Next, as shown in FIG. 1D, the structure is masked with a mask 14 having transparent regions 15 and opaque regions 16. The mask which may be a contact mask or a projection mask is shown in the illustration as being slightly offset from the surface merely for purposes of clarity. The exposure is to a 200 Watt mercury lamp for approximately 10 seconds. As a result of this exposure, regions 17 in positive photoresist top layer 12 coincident with the transparent areas 15 in the mask are solubilized to the extent shown. Regions 18 in the bottom positive photoresist layer 10 which are also exposed to light through transparent regions 15 and through layers 12 and 13 which are also transparent, are solubilized to a greater extent than coincident regions 17. This occurs because the positive photoresist material in bottom layer 10 is "faster" than that in the top photoresist layer 13.

Then, FIG. 1E, the structure is subjected to a first developing step utilizing a conventional alkaline developer for positive photoresist, e.g., a 2.5 percent by weight solids in aqueous solution of a mixture of sodium-metasilicate and sodium phosphate, predominantly sodium-orthophosphate having a pH at room temperature of about 12.55 for about 30 seconds. Solubilized portions of top photoresist layer 13 are removed, leaving apertures 19. Then, FIG. 1F, the portion of intermediate polymeric layer 12 exposed in aperture 19 is removed. This may be accomplished by ashing, using standard ashing techniques known in photolithography. Ashing involves the removal of material by activated oxygen. A typical ashing technique is described in the "Handbook of Thin Film Technology", L. I. Maissel et al., McGraw-Hill, 1970, page 7–42. Ashing involves the use of an RF generated plasma containing activated oxygen to oxidize the photoresist into its volatile components. No external heating is required; the wafers subject to the plasma assume temperatures of from 100°C to 300°C. The structure of FIG. 1E is subjected to an activated oxygen plasma at pressure in the order of 0.5 to 0.8 Torrs in a chamber having an oxygen flow rate of 100 cc/min. for 2½ minutes to remove exposed section 20 of polymeric layer 12, as shown in FIG. 1F. Another suitable technique for such removal by dry ashing is described in "The Kodak Photoresist Seminar Proceedings," 1968 Edition, Volume 2, at pp. 26–29.

Where layer 12 is soluble in strong aromatic solvents such as xylene, alternatively the section 20 may be removed by dissolving it in the xylene.

As shown in FIG. 1G, the structure is then again subjected to the previously described positive photoresist developing step to remove solubilized regions of bottom photoresist layer 10 to provide apertures 21 which are coincident with apertures 19 but have greater lateral dimensions. As a result, the structure has overhang 22 formed by the coincident apertures.

It should be again noted that the present invention is not limited to any particular compositions of positive photoresist. The only critical aspect of the photoresist is that the bottom layer of photoresist be "faster" than the top layer of positive photoresist. It will be clear to one skilled in the art how to select from among the conventional positive photoresists, such as those described in U.S. Pat. Nos. 3,046,120 and 3,201,239, those which are considered as "faster" or "slower" dependent upon the extent of solubilization to developer upon exposure to light.

In the present illustrative example of the preferred embodiment, we have indicated that intermediate polymeric layer 12 may be a negative photoresist material or a polymeric material. THe material must be one which is in no way solubilized upon exposure to light. In addition to the group of polymeric coating compositions suggested above, a great many negative photoresist compositions may be used for polymeric layer 12, particularly those which are applied in vehicles and are developed with developers which do not affect the positive photoresist layers used. Such developers and vehicles would include aliphatic hydrocarbons, aromatic hydrocarbons and water. Another negative photoresist composition which may be used is KMER (a cyclized natural rubber based photoresist).

In the next step, FIG. 1H, using the lift-off composite of FIG. 1G as a substrate mask, a metallic film 23 is deposited at a temperature between room temperature and 100°C. Alternatively, layer 23 may be an inorganic electrically insulative material, such as silicon dioxide or silicon nitride. These insulative materials may be deposited in any conventional sputter deposition system. In the embodiment shown, a metallic film is used. The metal may be any metal conventionally used for integrated circuit metallization, e.g., aluminum, aluminum-copper alloys, platinum, palladium, chromium silver, tantalum, gold and titanium or combinations thereof. Metal film 23 has a thickness of ~12,000A.

Next, using conventional lift-off removal techniques, the composite formed by layers 10, 12 and 13 is completely removed by immersion into a solvent, such as N-methylpyrrolidone, a standard photoresist stripping solvent for about 10 minutes using ultrasonic agitation. This leaves thin metal film 23 in the desired, preselected configuration, FIG. 1I. The solvent selected should be one which dissolves or swells the polymeric material of layer 10 without affecting the thin metallic film 23. Such solvents include acetone, butylacetate, trichlorethylene and Cellosolve acetate.

It should be noted that the term "thin film" as used in the present specification and claims is not meant to define any particular film thickness but rather to designate the thin film technology.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of depositing patterned thin films on an inorganic substrate comprising:
    forming on said substrate, a bottom layer of positive photoresist material,
    forming over said bottom layer, a discrete light-transparent top layer of positive photoresist material which is less solubilized in developer by exposure to light than is the material in said bottom layer,
    simultaneously exposing said layers to the same selected pattern of light,
    applying developer for said photoresist materials to said top and bottom layers to thereby form an aperture pattern through said top layer corresponding to said light pattern and a corresponding aperture pattern through said bottom layer coincident with and laterally wider than said top layer apertures, and
    depositing said thin films onto said substrate through said coincident aperture patterns using said photoresist layers as a deposition mask.

2. The method of claim 1 wherein said developer is applied sequentially to said top and bottom layers to form said aperture patterns in separate steps.

3. The method of claim 2, including the further steps of
    forming on said bottom layer prior to formation of said top layer, an intermediate layer of a light-transparent polymeric material which is immiscible with said bottom layer and unaffected by the subsequently applied top layer, and
    removing a portion of said polymeric layer to form an aperture pattern therethrough corresponding to the top layer pattern prior to applying said developer to said bottom layer.

4. The method claim 3 wherein said top and bottom layers are several times the thickness of said intermediate polymeric layer and after developing the top layer said intermediate polymeric layer exposed in said aperture pattern is removed by an ashing step.

5. The method of claim 4 wherein said intermediate polymeric layer comprises a negative photoresist material.

6. The method of claim 3 wherein said substrate is a semiconductor substrate.

7. The method of claim 3 wherein said substrate is a metallic oxide.

8. The method of claim 7 wherein said substrate is silicon dioxide.

9. The method of claim 1 including the further step of removing the remainder of photoresist layers after the deposition of the thin films.

10. The method of claim 4 including the further step of removing the remainder of photoresist layers after the desposition of the thin films.

11. The method of claim 3 wherein said thin films are metallic.

12. A structure used in photolithographic fabrication of integrated circuits comprising
an inorganic substrate covered with a composite comprising
a bottom layer of positive photoresist,
a top layer of light-transparent positive photoresist which is less solubilized in developer by exposure to light than is the material in said bottom layer, and
a layer between said bottom and top layers of a light-transparent polymeric material which is not solubilized upon exposure to light.

13. The structure of claim 12 wherein said polymeric layer comprises a negative photoresist material.

14. The structure of claim 12 wherein said substrate is a semiconductor substrate.

15. The structure of claim 12 wherein said substrate is a metallic oxide.

16. The structure of claim 15 wherein said substrate is silicon dioxide.

* * * * *